(12) United States Patent
Iwata

(10) Patent No.: US 6,456,078 B1
(45) Date of Patent: Sep. 24, 2002

(54) NUCLEAR MAGNETIC RESONANCE DEVICE

(75) Inventor: Yosuke Iwata, Kyoto (JP)

(73) Assignee: Shimadzu Corporation, Kyoto (JP)

( * ) Notice: Subject to any disclaimer, the term of this patent is extended or adjusted under 35 U.S.C. 154(b) by 0 days.

(21) Appl. No.: 09/978,584

(22) Filed: Oct. 18, 2001

(30) Foreign Application Priority Data

Oct. 31, 2000 (JP) ........................................ 2000-331652

(51) Int. Cl.⁷ ................................................. G01V 3/00
(52) U.S. Cl. ...................... 324/321; 324/322; 324/300
(58) Field of Search ................................ 324/321, 322, 324/360, 303, 304, 307; 422/70; 210/640, 198

(56) References Cited

U.S. PATENT DOCUMENTS

| | | | | |
|---|---|---|---|---|
| 4,195,260 A | * | 3/1980 | Sakamoto et al. | 324/204 |
| 4,654,592 A | * | 3/1987 | Zens | 324/307 |
| 4,766,373 A | * | 8/1988 | Chambers et al. | 324/204 |
| 5,057,225 A | * | 10/1991 | Hook et al. | 210/640 |
| 5,283,036 A | * | 2/1994 | Hofmann et al. | 422/70 |
| 5,528,138 A | * | 6/1996 | Rumberger et al. | 324/304 |
| 5,663,642 A | * | 9/1997 | Rumberger et al. | 324/304 |
| 6,177,798 B1 | * | 1/2001 | Haner et al. | 324/321 |
| 6,346,813 B1 | * | 2/2002 | Kleinberg | 324/303 |

OTHER PUBLICATIONS

Publication, Title: LC/NMR by Masahiko Okamoto, Masaharu Kimura, Kenichi Takahashi and Yoshiyuki Takimoto, Published in "BUNSEKI" (analysis) No. 11 of 1997.

* cited by examiner

Primary Examiner—Edward Lefkowitz
Assistant Examiner—Brij B. Shrivastav
(74) Attorney, Agent, or Firm—Kanesaka & Takeuchi

(57) ABSTRACT

An NMR device includes an NMR coil, and a sample flow path connected to a sample supply source and passing through the NMR coil. The NMR device can carry out an on-line measurement so that a portion passing through the NMR coil of the sample flow path functions as an NMR probe for measurement. A filler for absorbing a sample is provided at a position of the NMR probe in the sample flow path, and the NMR measurement is carried out in a state where the sample is absorbed by the filler. Thus, when the measurement is carried out, the sample is retained accurately at the NMR coil position while a very small quantity of sample is being concentrated.

6 Claims, 4 Drawing Sheets

NUCLEAR MAGNETIC RESONANCE DEVICE

BACKGROUND OF THE INVENTION AND RELATED ART STATEMENT

The invention relates to a nuclear magnetic resonance device (hereinafter referred to as "NMR device") wherein a sample supply source and the NMR device are connected through a flow path, so that a sample supplied from the sample supply source can be analyzed on-line. For example, the present invention is applied to a case such that a liquid chromatograph (hereinafter referred to "LC") device and the NMR device are connected through the flow path, and the sample taken out of the LC device is sequentially sent to the NMR device to carry out a measurement.

In the NMR measurement, there has been widely used an off-line measurement wherein the sample is collected to respective sampling tubes with bottoms by using a heavy water type (heavy alcohol-type) solvent necessary for the measurement, and the respective sampling tubes are separately attached to an NMR probe, i.e. measuring probe, positioned in a measuring space of the NMR device to carry out the NMR measurement. However, recently, in order to automate the measurement, there has been also used an NMR device of an on-line measurement to send the sample through a flow path directly from the sample supply source without using the sampling tubes with the bottoms.

FIG. 3 is a block diagram showing a conventional liquid chromatograph-nuclear magnetic resonance system (hereinafter referred to as "LC-NMR system") wherein the LC device and NMR are connected on line. The system includes an LC portion and an NMR device.

In the LC portion, a mobile phase 1 is sent to a flow path by a liquid sending pump 2, and a sample is introduced from a sample introducing portion 3 disposed on a middle way of the flow path. The introduced sample is subjected to component separation at a column 4, and every component is sequentially sent through the column 4. The movable phase 1 is prepared by controlling concentrations of a heavy water-type solvent which has a high ability for allowing the column to absorb the sample, and a heavy alcohol-type solvent which has a low ability for allowing the column to absorb the sample. Incidentally, the reason why a light water-type solvent and a light alcohol-type solvent are not used is that in case an NMR measurement, described later, is carried out, it is necessary to use the heavy water-type/heavy alcohol-type solvents instead of the light water-type/light alcohol-type solvents. Then, the sample components passing through the column 4 are detected by a detector 5 for carrying out the measurements by an electric conductivity and UV.

The NMR device is structured such that a measuring space is provided in a ferromagnetic field space formed of electromagnets, and an electromagnetic wave necessary for the NMR measurement is generated in the measuring space by a device control portion. Also, an NMR coil 20 for receiving and sending the measured electromagnetic wave signal is attached thereto.

A sample flow path 21 is connected to the latter step of the detector 5 of the LC portion so that the flow path 21 passes through the NMR coil 20 in the axial direction. Then, a capacity of the pipe from the detector 5 to the NMR coil 20 is measured in advance and a liquid transfer speed, i.e. liquid transfer quantity per unit hour, of the mobile phase can be obtained from the rotation number of the pump, so that a time from a moment when the sample to be measured is detected at the detector 5 to a moment when the sample to be measured arrives at the NMR coil position, can be calculated.

Therefore, when the detector 5 detects the sample to be measured, a time when the sample to be measured arrives at the NMR coil position is calculated based on a pipe capacity and a liquid transfer speed and the liquid transfer of the mobile phase is stopped immediately after the arriving time elapses, so that the sample can be retained in the NMR coil position. Thus, the NMR measurement of the substances present in the sample flow path area at the NMR coil position can be carried out. Or, even if the liquid transfer is not stopped, when the measurement is started corresponding to the time when the sample passes through the NMR coil position, the NMR measurement of the sample to be measured can be done.

Thus, since the NMR measurement can be carried out only at the portion passing through the NMR coil 20 out of the entire sample flow path 21, an NMR probe 22 for the measurement is substantially formed by the NMR coil 20 and the part of the sample flow path 21 passing through the NMR coil 20. Incidentally, the end portion of the sample flow path 21 is connected to a drain to thereby abandon the sample after measurement.

FIG. 4 is an enlarged drawing of the NMR probe portion in FIG. 3. The NMR coil 20 is wound around a cylindrical tube 23. The sample flow path 21 passes through the tube 23.

As described above, in the conventional NMR probe 22, the hollow sample flow path 21 passes through the NMR coil 20 as it is. In case the sample is measured in the device, there is employed either a method wherein when the sample is sent, the sample is measured within the time while the sample flows in the NMR probe 22, i.e. on-flow measurement, or a method wherein when the sample is sent, the liquid transfer pump 9 is stopped to temporarily stop flow of the sample so that the sample is retained in the NMR probe 22 to extend an integrating time and measure, i.e. stopped-flow measurement.

However, in case the on-flow measurement is carried out, for example, there may be a case wherein when a flow speed of the sample is fast, a sufficient measuring time can not be taken and a proper integrating process can not be done, which results in a measurement with a lower S/N ratio. On the other hand, in case of the stopped-flow measurement, since the sample is inevitably dispersed in the back-and-forth direction in the flow path during the suspension, for example, there may be a case wherein only the sample in the order of 30% of the entire quantity remains in the vicinity of the NMR coil. Even if the integrating time is extended through the integrating process, the sufficient S/N ratio can not be obtained due to dilution of the sample dispersion as a whole. Also, due to the dispersion of the sample, a quantitative measurement may not be carried out.

Also, when the sample to be measured arrives at the position of the NMR coil 20, the NMR measurement is carried out. However, it is very difficult to accurately determine the timing. For the sake of safety, the sample is normally sent in a slightly dispersed state so that a flow path length where the sample to be measured is present becomes longer when compared with the length of the sample flow path in the NMR coil. Thus, even if the timing is slightly shifted, it has to be practiced that the sample is present in the position of the NMR coil. Therefore, the quantity of the sample actually contributing to the measurement is only a part out of the whole measuring sample sent from the sample supply source, so that there has been a limit for raising the S/N ratio.

Further, the expensive heavy water/heavy alcohol-type solvents have to be used at the time of the NMR measurement. However, such an expensive solvent should be used as little as possible. In other words, if possible, light water/light alcohol-type solvents should be used as much as possible. Especially, since the heavy alcohol-type solvent is extremely expensive, it is desirable to reduce its using quantity. In a system wherein the LC portion is connected in the preceding step of the NMR device as described above, since the separation column is provided, it is necessary to use a mixture wherein the heavy alcohol type-solvent is mixed in the mobile phase (because it is difficult to allow the sample to pass through a long column by only the heavy water-type solvent), a large quantity of the expensive heavy alcohol is required.

Furthermore, while it is necessary to keep the sample at a high concentration as much as possible during the NMR measurement, after completion of the measurement, it is desirable to discharge the sample from the NMR probe position as quickly and effectively as possible.

In view of the above problems, the present invention has been made and an object of the invention is to provide an NMR device, wherein a measurement with a high sensitivity and S/N ratio can be made by effectively using a very small quantity of sample.

Another object of the invention is to provide an NMR device as stated above, wherein a flowing sample can be easily and accurately held at a measuring position.

A further object of the invention is to provide an NMR device as stated above, wherein an expensive solvent to be used at the NMR measurement can be reduced as little as possible.

A still further object of the invention is to provide an NMR device as stated above, wherein the sample can be extremely concentrated when it is required to retain the sample in the NMR probe for measurement, and when it is required to discharge the sample from the NMR probe after the measurement, the sample can be discharged quickly and effectively.

A still further object of the invention is to provide an NMR device as stated above, wherein when an on-flow measurement is carried out, it is possible to control a time for retaining the sample in the NMR probe.

Further objects and advantages of the invention will be apparent from the following description of the invention.

SUMMARY OF THE INVENTION

In order to attain the above objects, according to a first aspect of the invention, an NMR device includes an NMR coil for receiving and sending an electromagnetic wave in a measuring space of the NMR device, and a sample flow path connected from a sample supply source and passing through the NMR coil. In the NMR device wherein a portion passing through the NMR coil out of the whole sample flow path functions as an NMR probe to thereby carry out an on-line measurement, a filler for absorbing the sample in the sample flow path of the NMR probe position is provided.

According to a second aspect of the invention, an NMR device includes an NMR coil for receiving and sending an electromagnetic wave provided in a measuring space of the NMR device, and a sample flow path connected to the sample supply source and passing through the NMR coil. In the NMR device wherein only a portion passing through the NMR coil out of the whole sample flow path functions as an NMR probe to thereby carry out an on-line measurement, a filler for absorbing the sample is provided in the sample flow path of the NMR probe. Also, a sample supply flow path connected to the sample supply source of the sample flow path provided on an upper stream side than the NMR probe and a solvent flow path for substituting a solvent are connected to be switched over by a switching device.

According to a third aspect of the invention, an NMR device includes an NMR coil for receiving and sending an electromagnetic wave provided in a measuring space of the NMR device, and a sample flow path connected to pass through the NMR coil from a sample supply source. In the NMR device wherein only a portion passing through the NMR coil out of the whole sample flow path functions as an NMR probe to thereby carry out an on-line measurement, a filler for absorbing the sample is provided in the sample flow path of the NMR probe. Also, a sample supply flow path connected to the sample supply source of the sample flow path provided on an upper stream side than the NMR probe and a solvent flow path for selectively substituting from more than two solvents or a mixture thereof, are connected to be switched over by a switching device.

According to the first aspect of the invention, since the filler for absorbing the sample is provided in the sample flow path passing through the NMR probe portion, the sample flowing through the flow path is positively caught by the filler in the NMR probe. By selecting the kinds of the filler and the solvent, the retained time of the sample can be controlled. Thus, by selecting the filler and the solvent according to the sample, a sufficient integrating time necessary for the measurement can be obtained. Also, since the sample itself is caught by the filler, the sample is concentrated and not dispersed in the sample flow path. Thus, even if a measurement is carried out with a very small quantity of the sample, there are no problems such that an S/N ratio is reduced, and a quantitative measurement is impossible.

According to the second aspect, the cheap light water/ light alcohol-type solvents are used while the sample flows from the sample supply source to the switching device, and the heavy water/heavy alcohol-type solvents are used in the sample flow path after the switching device. Thus, a quantity of the expensive heavy water/heavy alcohol-type solvents to be used can be reduced.

According to the third aspect, since an absorbing ability of the sample by a combination of the solvent and the filler supplied from the solvent flow path can be controlled, a solvent having a high absorbing ability of the sample is used during the measurement, and a solvent having a low absorbing ability of the sample is used after the measurement to thereby quickly discharge the sample. Or, in an on-flow measurement, a remaining time of the sample in the NMR probe can be controlled at will by properly mixing more than two solvents.

DETAILED DESCRIPTION OF PREFERRED EMBODIMENTS

Figure 1:
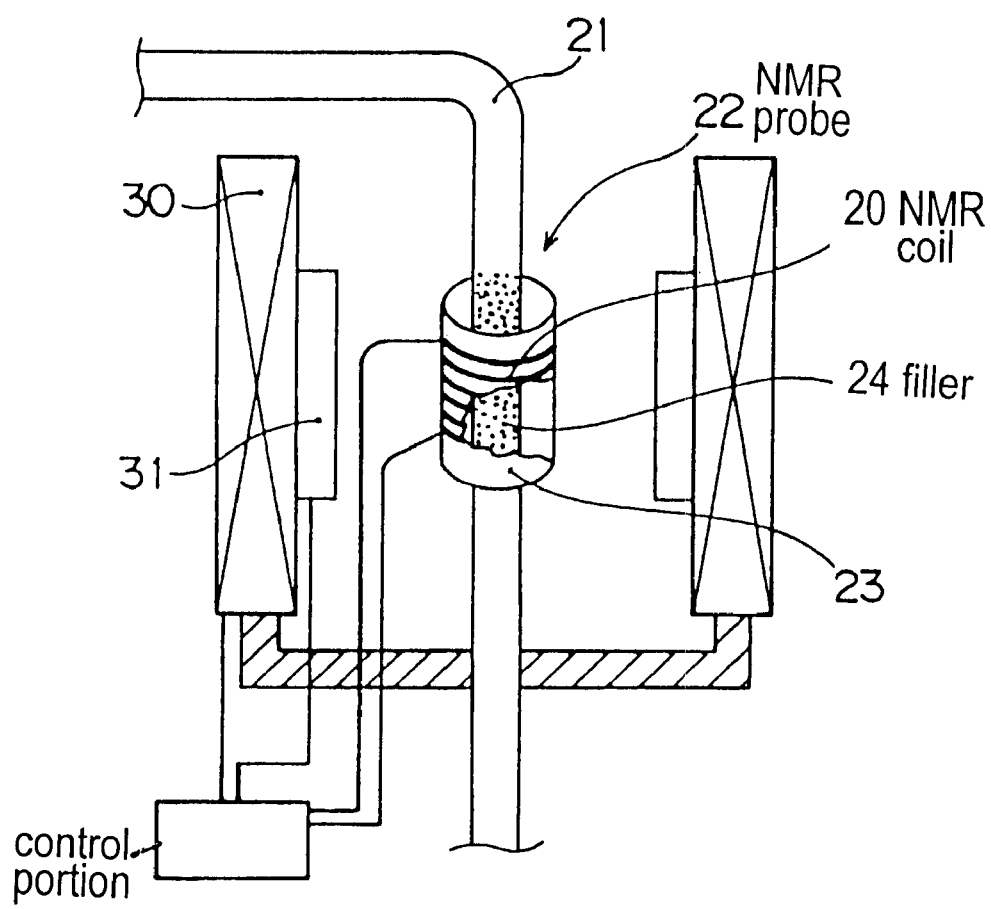
FIG. 1 is an explanatory perspective view showing a structure of an NMR device of an embodiment according to the present invention.

Hereunder, with reference to the accompanying drawings, embodiments of the invention will be explained. FIG. 1 is a perspective view showing a structure of an NMR device of an embodiment according to the present invention.

As shown in FIG. 1, the NMR device includes a pair of coil electromagnets 30 for generating a ferromagnetic field and a pair of electromagnets 31 for generating a sweep magnetic field so that a measuring space is formed therebetween, and an NMR coil 20 attached in the measuring space. The NMR coil 20 is wound around a cylindrical tube 23 so that the NMR coil 20 does not easily deform.

On the other hand, a sample flow path 21 formed of a glass tube connected as a flow path from a sample supply source, i.e. an LC portion, passes through the NMR coil 20, and is filled with a filler 24 at a position where the sample flow path 21 passes through the NMR coil 20. As the filler, a substance having a high adsorption ability relative to a water group, such as light water and heavy water, and a low adsorption ability relative to an alcohol group, such as light alcohol and heavy alcohol, can be used. For example, fluorocarbon is most preferable as a filler, but it is possible to select a suitable substance according to the sample to be measured.

When the sample is sent through the sample flow path 21 from the sample supply source, the NMR measurement is carried out with respect to the sample present at the position of the filler 24. A function as an NMR probe 22 can be substantially attained by the NMR coil 20, the sample flow path 21 and the filler 24.

Controls of the coil electromagnets 30 and sweep magnetic field electromagnets 31, and further, a signal process of the NMR coil are carried out by a device control portion, whereby the NMR measurement can be executed.

According to the device, when a sample sent by the heavy water solvent or a mixed solvent of the heavy water and heavy alcohol arrives at the position of the filler 24, the sample stays there through absorption of the filler 24. Under the condition, the liquid supply is stopped, or while supplying the liquid, the NMR measurement is carried out in an on-flow state. As a result of the absorption action of the filler 24, since the sample can be concentrated and the staying time of the sample in the NMR prob 22 can be greatly increased, an integrating process can be carried out for a long time with a highly concentrated sample, so that measurement with a high S/N ratio can be carried out. Also, even if the liquid supply is stopped, since the sample is not diffused due to the adsorption action of the filler, there are no such problems, which have been observed in the conventional device, that the N/S ratio due to the diffusion of the sample in the sample flow path is decreased and a quantitative analysis can not be carried out.

After completion of the measurement, the sample is discharged in a short time by supplying an alcohol type-solvent having a high concentration. The sample can be discharged by only the heavy water-type solvent having the high adsorption ability, since the filler is present in a short area, but it takes a long time, which results in waste of time and the solvent. Therefore, it is desirable to change to the alcohol type solvent.

Figure 2:
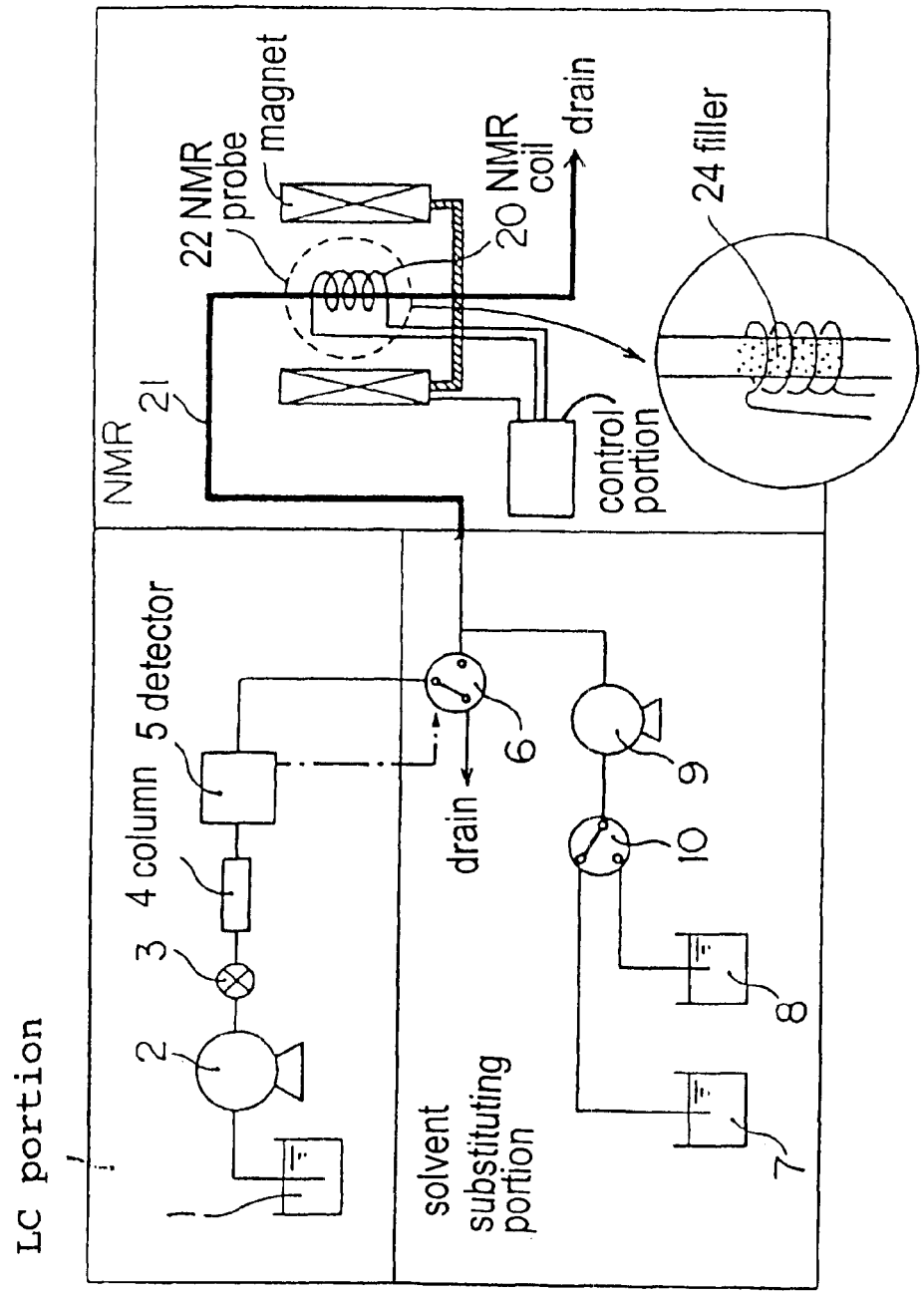
FIG. 2 is a block diagram showing a structure of an LC-NMR system to which the present invention is applied.

FIG. 2 is a block diagram showing an entire structure of an LC-NMR system using the NMR device as shown in FIG. 1. The LC-NMR system is constituted by an LC portion, a solvent substituting portion and the NMR device.

Figure 3:
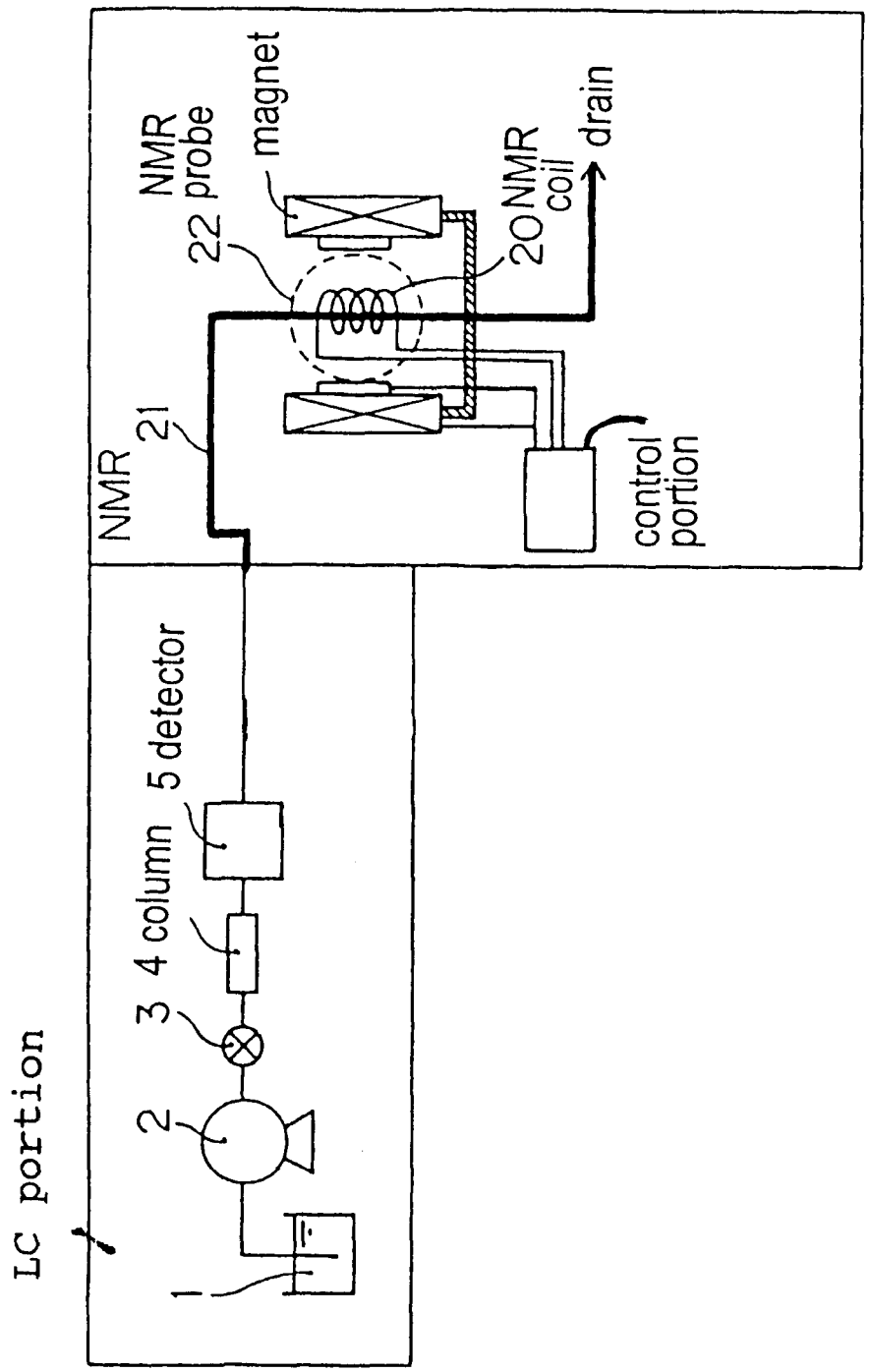
FIG. 3 is a block diagram showing a structure of a conventional LC-NMR system.
Figure 4:
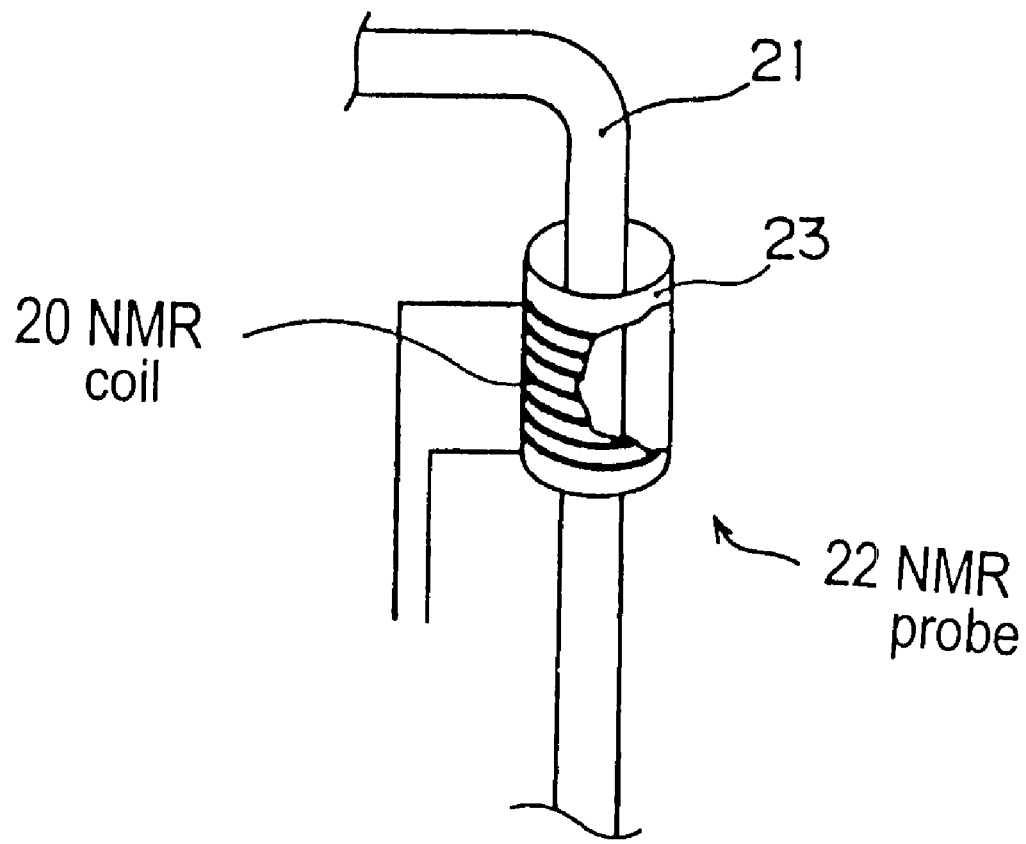
FIG. 4 is an enlarged diagram showing an NMR probe portion of the conventional NMR device.

Among the constituting portions, the LC portion is formed of a mobile phase 1, a liquid transfer pump 2, a sample introducing portion 3, a column 4 and a detector 5 connected in this order through a flow path. Since the structure is the same as that of the conventional LC portion as shown in FIG. 3, the same reference numerals are applied thereto and explanations therefor are omitted. Incidentally, a mixed solvent of light water and light alcohol is used as the mobile phase 1. The mixed solvent is prepared to have a concentration such that the sample can be properly separated in the column 4. The reason why the heavy water and heavy alcohol are not used as the mobile phase 1 is that the solvent can be substituted at the solvent substituting portion, described later, to thereby prevent the expensive solvent from being used at this portion.

The solvent substituting portion of the LC-NMR system includes a switching valve 6, a first substituting solvent 7, a second substituting solvent 8, a liquid transfer pump 9 and a switching valve 10 for switching the first substituting solvent 7 and the second substituting solvent 8.

Heavy water expensive more than light water is used as the first substituting solvent, and heavy methanol expensive more than heavy water is used as the second substituting solvent. Since heavy water and heavy methanol have different solvent intensities, an elution ability of the sample caught by the filler can be adjusted by using properly heavy water or heavy methanol or a mixture while controlling the concentration thereof. Incidentally, the cheap water/light alcohol solvents as used in a normal liquid-chromatography are used up to the switching valve 6 in the LC portion.

The NMR device of the LC-NMR system includes the sample flow path 21 connected to the rear part of the switching valve 6 through the flow path, the filler 24 filled in the middle of the sample flow path 21, the NMR coil 20 wound around the sample flow path where the filler 24 is filled, and a magnet for forming a magnetic field necessary for the NMR measurement at a position of the NMR coil 20.

Next, the operation of the system is explained. A sample is poured from the sample introducing portion 3 by actuating the LC portion in a state that the switching valve 6 is connected to a drain side. The sample is subjected to a component separation at the column 4 and the respective components are sequentially sent to the detector 5 which keeps detecting a signal for every component. The switching valve 6 is connected to the drain side while unnecessary signals among the signals for the respective components are being produced. Once the detector 5 detects a signal for a desired component, a switching signal is sent to the switching valve 6 from the detector 5 by choosing a suitable timing, so that the flow path is shifted to the side of the sample flow path 21 from the drain side. Thus, a specific component is introduced into the sample flow path 21. The first substituting solvent 7 (heavy water) is sent to the sample flow path 21 by the switching valve 10 and the liquid transfer pump 9 simultaneously with the valve switching, and the sample and the mixed solvent of light water and light alcohol sent from the LC portion are mixed in the sample flow path 21, so that the sample is diluted by heavy water. Thereafter, when the detector 5 terminates detection of the signal for the desired component, the switching valve 6 is again switched to the drain side by choosing a proper timing.

Through the above-described operation, the sample moves in the sample flow path 21 while being diluted by heavy water and arrives at the NMR coil position. Thus, the sample is present in the heavy water solvent necessary for the NMR measurement. Incidentally, in case not only the first substituting solvent 7 but also the second substituting solvent 8 are urged to flow, the sample is present in a mixed solvent of heavy water/heavy alcohol.

Thus, when the sample arrives at the position of the filler 24, the sample stays there by being absorbed by the filler 24.

Since the sample is diluted by the heavy water having high absorbing ability, the sample is easily absorbed. Under the state, the NMR measurement is carried out by stopping transfer of the liquid through the liquid transfer pump 9.

Since the sample is stopped there for a time necessary for the measurement through the absorption action of the filler, highly concentrated sample can be measured with a sufficient integrating time.

When the NMR measurement is completed, the solvent is changed to the second solvent 8, i.e. heavy methanol, which can suppress the absorption ability of the filler 24 with respect to the sample. In other words, by switching the switching valve 10 to allow the second solvent 8, i.e. heavy methanol, to flow into the sample flow path 21, the sample retained by the filler 24 starts to flow toward the drain to thereby quickly discharge the sample. As described above, by properly selecting the solvents, it is possible to allow the sample to stay in the NMR probe 22 or to be discharged.

In the above operation, while the first solvent 7 and the second solvent 8 flow separately, the flow quantity ratio of the two solvents may be properly controlled. In this case, an on-flow analysis is carried out. In case the switching valve 10 is used, by controlling the opening-closing time according to the flow quantity ratio, a suitable flow quantity ratio can be obtained. However, instead of the switching valve 10, it may be possible that flowmeters may be provided to the respective flow paths to flow together to thereby control the flow quantities.

Since a heavy hydrogen type solvent, such as heavy water and heavy methanol, is generally expensive as compared with light water and light alcohol, when the above-described method is employed, consumption of the expensive heavy solvent can be reduced to a great extent, which results in decrease in a running cost. A heavy organic solvent, such as heavy methanol, is especially expensive, and when compared with a case wherein the heavy organic solvent is used as the solvent for passing through the separating column in the conventional LC portion, a using quantity of the heavy organic solvent in the present invention can be greatly reduced.

While the LC device, i.e. LC portion, is used as a sample supply source in the above embodiment, the sample supply source is not limited thereto, and any device wherein the sample can be sequentially supplied on a line can be used.

Further, in the above embodiment, the switching valve 6 functions to shift the flow path from the drain side to the sample flow side and vice versa. However, when a plurality of components to be measured is separately taken and sequentially measured, divided plural flow paths may be connected in parallel through a switching valve in order to hold the respective components temporarily, and a trap flow path may be switched for every component. Then, after the respective components are held in the divided flow paths, the sample to be measured may be sequentially sent to the sample flow path from the trap flow path.

In an alternative embodiment, in measuring a specific component in the NMR device, light water is supplied through the pump 9 to allow the component to be absorbed at the NMR probe. At this time, an amount of light water to be used is several times (for example, ten times) greater than that used in the LC portion. As a result, the absorption ability is improved to increase the recovery rate. Thereafter, heavy water is supplied by the pump 9 or other pump. An amount of heavy water to be used here is several times greater than the volume of the piping, so that the consumption of heavy water is suppressed.

Summarizing the embodiment of the invention, in the first aspect of the invention, the NMR device has the NMR coil provided in the measuring space of the NMR device to receive and send an electromagnetic wave, and the sample flow path connected to the sample supply source and passing through the NMR coil, and carries out an on-line measurement to function as the NMR probe to be measured only by a portion passing through the NMR coil of the sample flow path, wherein a filler comprising fluorocarbon for absorbing the sample is provided in the sample flow path corresponding to the NMR probe position.

In the NMR device according to the first, second and third aspects of the invention and the structure as stated above, the LC device is used as the sample supply source.

As described above, since the NMR device according to the invention is provided with the filler for absorbing the sample at a portion functioning as the NMR probe of the sample flow path, even with a very small quantity of the sample, the sample sent from the sample supply source becomes a concentrated state. Also, the sample is not diffused during the measurement, and further, the sample is positively retained in the measuring position, which results in a high sensitivity measurement with a high S/N ratio.

Also, according to the second aspect of the invention, consumption of the expensive solvent can be reduced. Further, according to the third aspect of the invention, since the solvent intensity can be controlled, and the solvent having a high absorbing ability can flow during the measurement, and a solvent having a low absorbing ability can flow after the measurement. Thus, the solvent having the optimum solvent intensity can be used at the time of concentration or discharge.

While the invention has been explained with reference to the specific embodiments of the invention, the explanation is illustrative and the invention is limited only by the appended claims.

What is claimed is:

1. A nuclear magnetic resonance device, comprising:
   a nuclear magnetic resonance coil for receiving and sending an electromagnetic wave provided in a measuring space of the nuclear magnetic resonance device,
   a sample supply source for supplying a sample,
   a sample flow path connected to the sample supply source and passing through the nuclear magnetic resonance coil, said sample flow path having a portion passing through the nuclear magnetic resonance coil to function as a nuclear magnetic resonance probe so that an on-line measurement is carried out, and
   a filler disposed in the sample flow path at a position of the nuclear magnetic resonance probe for absorbing the sample.

2. A nuclear magnetic resonance device according to claim 1, further comprising a sample supply path connected between the sample supply source and the sample flow path upstream of the nuclear magnetic resonance probe, a solvent supply path connected to the sample flow path for supplying and substituting a solvent, and a switching device situated between the sample supply source and sample flow path for selectively supplying the sample to the sample flow path.

3. A nuclear magnetic resonance device according to claim 2, further comprising at least two solvent supply sources different from each other, and a solvent supply device connected to the at least two solvent supply sources so that solvents more than two or a mixture thereof is selectively supplied to the sample flow path.

4. A nuclear magnetic resonance device according to claim 3, wherein said solvent supply device is a switching device or a flow quantity controlling device.

5. A nuclear magnetic resonance device according to claim 3, further comprising a liquid chromatograph formed in the sample supply path for measuring components of the sample.

6. A nuclear magnetic resonance device according to claim 5, wherein said switching device includes a drain side for discharging a part of the sample passing through the liquid chromatograph so that a selected part of the sample can be mixed with the solvent supplied from the at least two solvent supply source through the solvent supply path.

* * * * *